United States Patent [19]

Shires

[11] 3,934,195

[45] Jan. 20, 1976

[54] PORTABLE ELECTRIC CAPACITOR TESTER USING AN LED INDICATOR

[75] Inventor: Val Henry Shires, Biscayne Park, Fla.

[73] Assignee: Surf Air Conditioning, Inc., Miami Beach, Fla.

[22] Filed: Feb. 4, 1974

[21] Appl. No.: 439,649

[52] U.S. Cl............................ 324/72.5; 324/60 C
[51] Int. Cl.² ................ G01R 31/02; G01R 11/52
[58] Field of Search.................. 324/72.5, 60 C, 133

[56] References Cited
UNITED STATES PATENTS

| 3,508,146 | 4/1970 | Jackson | 324/60 R |
| 3,555,420 | 1/1971 | Schwartz | 324/72.5 X |
| 3,796,951 | 3/1974 | Joseph | 324/133 X |

FOREIGN PATENTS OR APPLICATIONS

| 1,078,859 | 6/1968 | U.S.S.R. | 324/133 |

Primary Examiner—John Kominski
Assistant Examiner—R. Hille
Attorney, Agent, or Firm—Oltman and Flynn

[57] ABSTRACT

A portable electric tester energized by a self-contained battery including switch means and a Light Emitting Diode (LED) device for testing capacitors upon visual interpretation of the luminosity of the Light Emitting Diode.

1 Claim, 6 Drawing Figures

PORTABLE ELECTRIC CAPACITOR TESTER USING AN LED INDICATOR

BACKGROUND OF THE INVENTION

This invention relates in general to portable electric testing devices and more particularly to a pocket size meterless device having a Light Emitting Diode indicator for testing capacitors as to whether they are shorted, open, leaky, or capable of holding a capacitive charge, for testing continuity of electric circuits, and for indicating presence of a wide range of voltages.

Prior electric testing devices of this general character are dependent upon relatively expensive construction, including electric meter movements for indicating capacitance values, are relatively large and bulky for handling in close quarters and subject to failure from mishandling or shock. Others utilize a neon indicator as the heart of the tester which necessitates use of voltages in excess of 60 volts which can be hazardous to the operator.

SUMMARY OF THE INVENTION

The present invention overcomes the above objections and disadvantages by the provision of a relatively simple rugged battery energized tester of relatively small size for convenient handling and provides for testing a capacitor to determine if it is shorted, open, leaky, or capable of holding a capacitive charge.

A further object of the invention is the provision of such a tester having an additional switch which allows using the same Light Emitting Diode and associated circuit for indicating presence of both AC and DC voltages.

These and other objects and advantages in one embodiment of the invention are described and shown in the following specification and drawing, in which.

FIGS. 1, 2, 3, 4, and 5 show views of a casing having a cover portion 1 and a mating base portion 2 for retaining the circuit elements of the tester to be hereinafter described.

Figure 1:
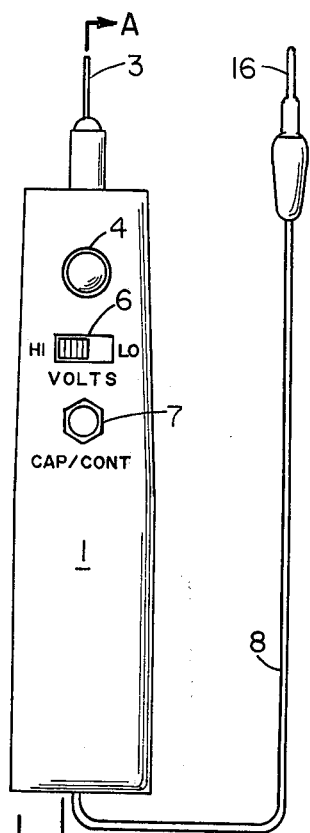
FIG. 1 is a front face view of the tester

Refering to FIG. 1, a probe tip 3 feeds through the upper end of the casing 1 which is connected to the circuit panel 12 as herewithin described. A transparent jeweled bullseye 4 is secured on the cover portion 1 for transmitting light from the Light Emitting Diode 5 (hereafter referred to as LED) on the circuit panel 12 adjacent thereto. Switches 6 and 7 are attached to the cover portion 1 and electrically connected to the circuit panel 12. The flexible test cord conductor 8 of predetermined length terminates at one end with an alligator type clip probe 16 and the opposite end is fed through the lower end of the casing 1 and is electrically connected to the circuit panel 12.

Figure 3:
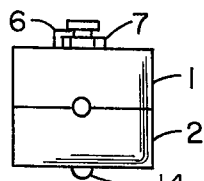
FIG. 3 is a lower end elevation of the tester shown in FIG. 1.

FIG. 3 shows the opening through which the flexible test cord conductor 8 is fed at the connection of casing portions 1 and 2.

Figure 4:
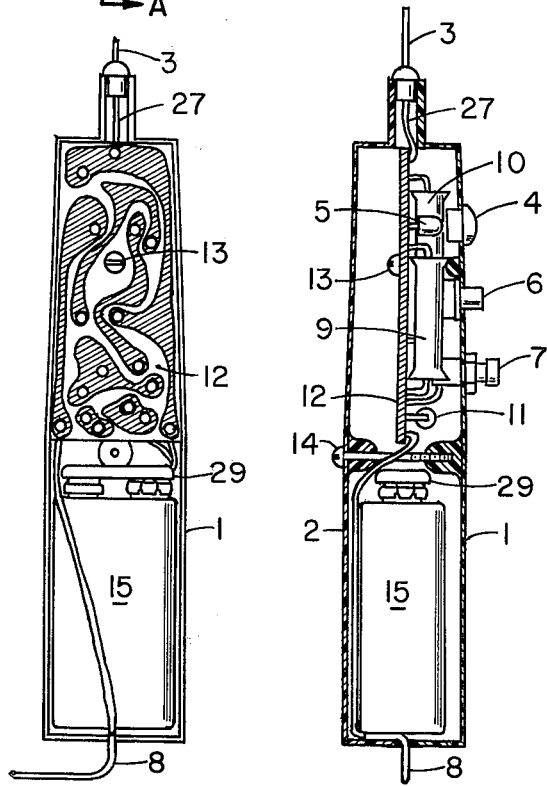
FIG. 4 is a plan view of the tester shown in FIG. 1 with rear cover removed, showing the underside of the panel shown in FIG. 2.

Referring to FIG. 4, a circuit panel 12, of uniform thickness made of dielectric material, such as fiber reinforced phenol formaldehyde plastic, contains a so called "printed circuit" of flat copper conductors retained on the surface of the rear side thereof and connected to all of the circuit components of the device mounted on the front surface of the circuit panel 12 and within the cover portion 1.

Figure 5:
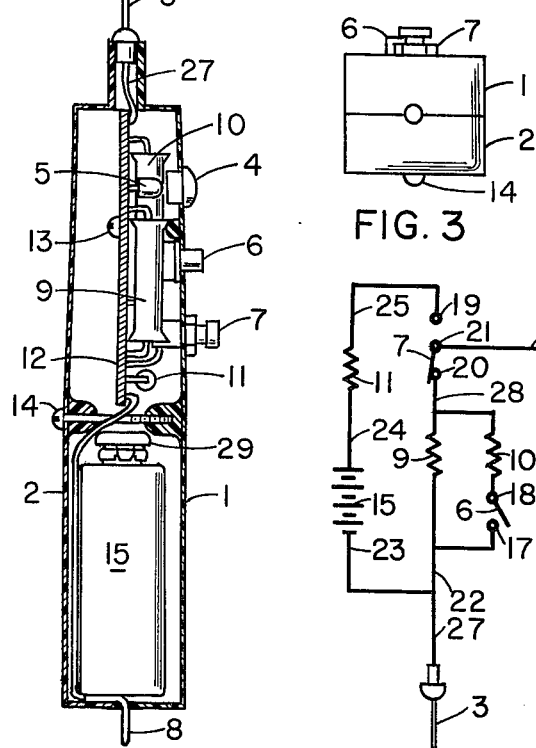
FIG. 5 is a cross sectional side view of the tester taken through section line A—A shown in FIG. 1.

The circuit panel 12 is secured within the cover portion 1 by screw 13 as shown in FIG. 5. The cover portion 1 and the base portion 2 are held together by screw 14, as shown in FIG. 5.

Figure 2:
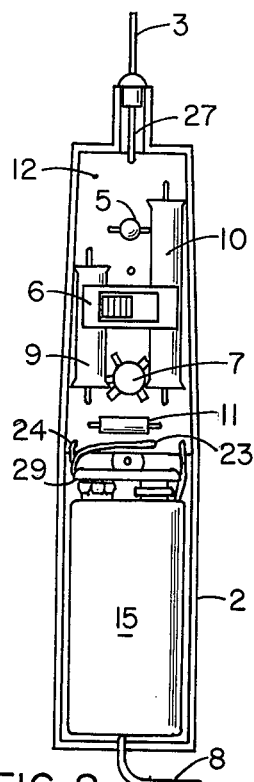
FIG. 2 is a plan view of the tester shown in FIG. 1 with the cover portion removed, showing the elements secured to the front side of a panel in the casing and the location of the battery and battery clip.

FIG. 2 shows the placement of all of the circuit elements on panel 12, which are retained thereon by the connection of their terminals, through the connection holes of panel 12 in FIG. 4, by known solder means.

In this particular embodiment, one 9 volt battery 15, such as Everready No. 216, is connected by a battery clip 29 to hereafter described portions of the printed circuit panel 12.

The terminals of S.P.S.T. switch 6 are connected to hereafter described portions of the printed circuit panel 12. The terminals of the momentary contact S.P.D.T. push button switch 7 are connected to hereafter described portions of the printed circuit panel 12.

In this embodiment, a LED 5 of the red and green visible light, dual LED type, such as Monsanto MV 5091, is positioned adjacent the transparent jeweled bullseye 4. The terminals of the LED 5 are connected to hereafter described portions of the printed circuit panel 12.

The resistors 9, 10, and 11 are connected to hereafter described portions of the printed circuit panel 12. Specific values of resistors in this particular embodiment for resistors 9, 10, and 11 are in the order of 15,000 ohms, 1,000 ohms, and 150 ohms, respectively. However, the specific resistances are dependent upon the LED 5 characteristics and the desired range of voltages to be tested, such as hereinafter described.

Figure 6:
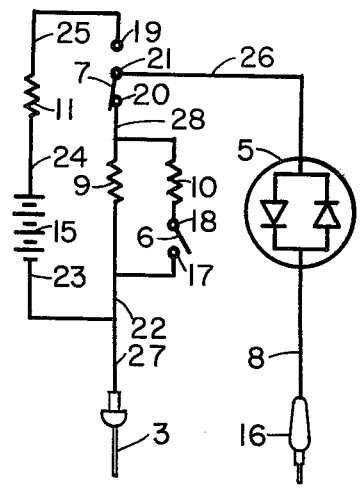
FIG. 6 is a schematic circuit diagram of the circuit panel shown in FIG. 4 for connecting the elements shown in FIG. 2.

Referring to the schematic diagram FIG. 6 of the printed circuit shown in FIG. 4, the clip probe 16 is connected to the LED 5 by test cord 8, the remaining terminal of LED 5 is connected to pole 21 of switch 7 by conductor 26, pole 19 of switch 7 is connected to one terminal of resistor 11 by conductor 25, the remaining terminal of resistor 11 is connected to the positive terminal of battery 15, and the negative terminal of battery 15 is connected to the probe tip 3 by conductors 23 and 27. Pole 20 of switch 7 is connected to the junction of resistor 9 and resistor 10 by conductor 28, the remaining terminal of resistor 10 is connected to pole 18 of switch 6, and pole 17 of switch 6 is connected to the junction of resistor 9 and battery terminal lead 23, which is connected to probe tip 3 by conductors 22 and 27.

In operation and before making capacitor or circuit tests, a test of the battery 15 is made by touching probe tip 3 to clip probe 16 and closing momentary contact switch 7, which will energize LED 5, producing a bright red light. It is apparent that the operation of this circuit also provides for the tester to be used as a continuity and resistance tester.

A capacitor to be tested, presumed to be in the range of values between 0.5 MFD to 500 MFD, is tested by connecting clip probe 16 to the positive terminal of the capacitor under test and touching probe tip 3 to the remaining terminal of the capacitor under test. It will be noted that if the capacitor under test is of the non-polarized type it makes no difference which terminal clip probe 16 is attached. Next the momentary contact switch 7 is depressed, corresponding to connecting the common pole 21 of switch 7 to the normally open pole 19 of switch 7. The circuit will be completed through a portion of the printed circuit, through the battery 15, through resistor 11, through LED 5, which will give a visual indication through bullseye 4 which is interpreted by the user to determine the electrical condition of the capacitor under test. With a little practice, the user will be able to interpret which electrical condition of the capacitor exists as follows: If the tested capacitor is short circuited, the LED 5 will produce a bright red light through the bullseye 4. If the tested capacitor is open circuited, the LED 5 will not produce any light through the bullseye 4. If the tested capacitor produces a voltage leak, the LED 5 will produce a visible red light in varying degrees through the bullseye 4 indicating proportionately the amount of voltage leakage. The greater the voltage leak the brighter the red light through the bullseye 4. If the tested capacitor is capable of holding a capacitive charge, the LED 5 will produce a bright light then turn itself off. This flicker of light denotes that the capacitor has accepted a charge and can be considered to be electrically good. Upon completion of the capacitor test, the momentary contact switch 7 is released, corresponding to connecting the common pole 21 of the switch 7 to the normally closed pole 20 of switch 7. The circuit will now be completed through a portion of the printed circuit, through the resistive network made up of resistor 9 and resistor 10, through the switch 7, through LED 5, which will give a flicker of green light indicating the tested capacitor is discharged. It will be noted that this discharge function is essential in that it will allow for multiple tests on the same capacitor and that it will remove any shock hazard to the user.

The present invention is useful for indicating the presence of voltage, either AC or DC, for voltages ranging from 6 volts to 600 volts in two ranges. In addition, the present invention will visually indicate if the tested voltage is AC or DC and if DC, will indicate polarity. It will be noted that when measuring DC voltages this discussion assumes polarity will be that of probe tip 3 relative to the clip probe 16.

Before making a voltage test the user must decide which voltage range the voltage to be tested will be within. The slider switch 6 is used to select either the 6 volts to 60 volts range or the 60 volts to 600 volts range corresponding to the "LO" and "HI" positions of the slider switch respectively. The recommended procedure for testing unknown voltages is to select the HI position of the slider switch 6 initially and if there is little or no indication from LED 5 through bullseye 4 then switch to the LO position of slider switch 6.

The voltage to be tested, presumed to be in the range between 6 volts and 60 volts, either AC or DC, is tested by connecting the clip probe 16 and the tip probe 3 thereto and placing the operator of the slider switch 6 in the LO position, corresponding to connecting the common pole 18 of switch 6 to pole 17 of swich 6. The circuit will be completed through a portion of the printed circuit, through a resistive network comprised of resistor 9 and resistor 10 in parallel, through the normally closed position of switch 7 pole 20 to pole 21, through LED 5 which will produce a red and green light, a red light or a green light, depending on whether the voltage under test is AC, positive DC, or negative DC, respectively, which will be visible in varying degress of brilliance through the bullseye 4. The brilliancy of the light will be proportional to the voltage under test. Thusly the LED 5 will produce an appropriate color close to the threshold of visibility when the voltage under test is close to 6 volts and will produce full brilliancy when the voltage under test is close to 60 volts.

The voltage to be tested, presumed to be in the range between 60 volts and 600 volts, either AC or DC, is tested by connecting the clip probe 16 to the tip probe 3 and placing the operator of the slider switch 6 of the HI position, corresponding to disconnecting the common pole 18 of switch 6 from pole 17 of switch 6. The circuit will be completed through a portion of the printed circuit, through resistor 9, through the normally closed position of switch 7, pole 20 to pole 21, through LED 5 which will produce a red and green light, a red light or a green light depending on whether the voltage under test is AC, positive DC or negative DC, respectively, which will be visible in varying degrees of brilliance through the bullseye 4. The brilliancy of the light will be proportional to the voltage under test. Thus, the LED 5 will produce an appropriate color close to the threshold of visibility when the voltage under test is close to 60 volts and will produce full brilliancy when the voltage under test is close to 600 volts. Thus the user, with little practice, will be able to determine the presence of a wide range of voltages and determine if the tested voltage is AC, positive DC, or negative DC.

This invention also comprehends the use of a wide range of LEDs of different characteristics described, as well as the use of batteries of different potentials for a variety of circuits of a large range of characteristics.

Having described my invention, I claim:

1. A portable electric tester for hand use comprising a casing having a cover portion and a demountable base portion, a panel member secured within said cover portion including a printed circuit means on the underside thereof for providing circuit conductors for said tester, and three resistor means secured to said printed circuit means, a battery means connected by a clip means and retained in said cover portion and connected in said circuit means, a S.P.S.T. switch means secured on the said upper side of said printed circuit panel with the two terminals thereof connected in said circuit means and with the finger operator thereof extending through said cover portion of said casing, a S.P.D.T. momentary contact switch means secured on the said upper said of said printed circuit panel with the three terminals thereof connected in said circuit means and with the push button operator thereof extending through said cover portion of said casing, a LED indicator means secured to said printed circuit panel with the two terminals thereof connected in said circuit means, a transparent jeweled bullseye secured through said cover portion of said casing adjacent to said LED indicator means, a tip probe means secured to said cover portion of said casing connected to said circuit means and a flexible test cord conductor means with one end of said test cord conductor means connected to said circuit means and the opposite end of said test cord conductor terminating in a clip probe means, both said probe means connected across a capacitor within a predetermined range of capacitances and the movement of said S.P.D.T. momentary contact switch means to the normally open position of said switch by said push button operator will energize said LED indicator and associated circuit means to produce a predetermined illuminance through said bullseye means with the said illuminance corresponding to the electrical condition of said capacitor under test and whereby when said push button operator of said S.P.D.T. momentary contact switch means is released to return to the normally closed position of said switch that said capacitor under test will discharge through said LED indicator and its associated circuit means to allow for subsequent testing of said capacitor and render said capacitor under test non-hazaradous to the user.

* * * * *